United States Patent [19]

Eckert

[11] 4,268,764
[45] May 19, 1981

[54] ZERO CROSSOVER DETECTOR

[75] Inventor: Kim Eckert, Austin, Tex.

[73] Assignee: Motorola, Inc., Schaumburg, Ill.

[21] Appl. No.: 35,040

[22] Filed: May 1, 1979

[51] Int. Cl.³ .................... H03K 5/153; H03K 3/295
[52] U.S. Cl. ................................. 307/354; 307/290;
328/150
[58] Field of Search ................ 307/252 UA, 354, 290;
328/146, 147, 150

[56] References Cited

U.S. PATENT DOCUMENTS

| | | | |
|---|---|---|---|
| 3,416,004 | 12/1968 | Taylor | 307/290 X |
| 3,718,864 | 2/1973 | Kelly et al. | 307/354 X |
| 3,916,328 | 10/1975 | Wilson | 307/354 X |

OTHER PUBLICATIONS

A. R. Hawkins, Wide Range and High Accuracy, Schmitt Electronic Engineering, May 1975, pp. 29-30.
P. R. Epley et al., Schmitt Trigger Circuit, IBM Technical Disclosure Bulletin, vol. 16, No. 5, Oct. 1973, pp. 1600-1601.

Primary Examiner—John Zazworsky
Attorney, Agent, or Firm—Vincent B. Ingrassia

[57] ABSTRACT

An A.C. zero crossover detection circuit compensates for RC phase lead by adding hysteresis to the reference voltage. A reference voltage is applied directly to a first input of a differential amplifier and indirectly through first and second resistor connected field-effect-transistors to a second input of the differential amplifier. An output of the amplifier is coupled to the gate of an MOS switch which, when turned on, reduces the reference voltage by a predetermined amount to compensate for early crossover detection resulting from the phase lead.

26 Claims, 4 Drawing Figures

ZERO CROSSOVER DETECTOR

BACKGROUND OF THE INVENTION

1. Field of the Invention

This invention relates generally to an A.C. zero crossover detector and, more particularly, to an A.C. zero crossover detector including means for compensating for phase error at both the positive going and negative going crossovers.

2. Description of the Prior Art

The advantages offered by MOS technology are well known; e.g. higher density, greater yield, etc. Thus, smaller MOS device geometries permit a greater number of devices to be produced per unit area or, stated another way, a single MOS device will occupy less space. This characteristic is extremely important in the design and fabrication of complex digital integrated circuits; for example, single chip microprocessors.

Whereas digital circuitry is generally characterized by its "ON/OFF" or "ONE/ZERO" nature, most measurements in the real world are inherently analog; e.g., temperature, pressure, speed, voltage, etc. Therefore, it is necessary that microprocessors and other digital circuitry communicate or interface with analog circuitry such as amplifiers, buffers, comparators, etc., in order to permit digital processing of the analog signals. The required interfacing may be accomplished by providing analog components which are external to the microprocessor chip. However, such arrangements generally require more current, a larger power supply and commonly present more opportunities for design and manufacturing errors. To avoid these disadvantages, analog circuits such as voltage crossover detectors are being manufactured integrally with the digital circuitry; e.g., on the microprocessor chip itself, and due to the complex nature of microprocessors, the inclusion of analog devices on the same chip requires that the same manufacturing process be employed. Thus, for example, a zero crossover detector included on a MOS microprocessor chip must be fabricated in accordance with MOS processing techniques, and the design of the zero crossover detectors must be tailored to such processing techniques.

It is well known that a resistor/capacitor (RC) circuit will cause an applied A.C. signal to be phase shifted thus producing an error in the detection of the zero crossovers of the A.C. signal. This phase shift can be reduced by increasing the resistance; however, this substantially increases the time necessary to charge the capacitor. To avoid this time loss, a controlled amount of hysteresis has been employed to partially compensate for the resulting phase shift. While this enabled detection of the positive going zero crossover point to within ±5 degrees, an offset error of 100mu resulted in the detection of the negative going zero crossover point.

Known zero crossover detection circuits suffer additional disadvantages. First, variations in $V_R$ will cause errors to be introduced into the zero crossover detection process. Second, additional errors will be introduced if the controlled amount of hysteresis does not track variations in the biasing circuit due to minor processing and fabrication variations.

SUMMARY OF THE INVENTION

It is an object of the present invention to provide an improved A.C. zero crossover detector.

It is a further object of the invention to provide a circuit which accurately detects both the positive and negative going zero crossover points of an applied A.C. signal.

It is a still further object of the invention to provide a zero crossover detection circuit employing a controlled amount of hysteresis to substantially cancel errors created by RC phase shift.

Yet another object of the invention is to provide a zero crossover detector requiring a single power supply.

Finally, it is an object of the invention to provide a MOS zero crossover detection circuit wherein biasing changes due to minor processing and fabrication variations are tracked by the hysteresis control circuit.

According to a broad aspect of the invention there is provided apparatus for compensating for phase shift in an applied A.C. input signal which would result in incorrect detection of crossover points of said A.C. input signal with a reference voltage, comprising: comparing means having a first input, a second input coupled to said reference voltage and an output responsive to said crossover points; and first means coupled to said comparing means for compensating for said phase shift at each of said crossover points.

According to a further object of the invention there is provided an A.C. zero crossover detection circuit of the type wherein an A.C. input signal is phase shifted by a capacitor in combination with an internal resistor, comprising: first means for generating a reference voltage; comparing means for comparing said reference voltage with an A.C. signal to detect the crossover points thereof; and second means coupled to said first means and to said comparing means for adjusting said reference voltage to compensate for phase shift at each of said crossover points, said resistor coupled between said first means and said comparing means.

The above and other objects, features and advantages of the invention will be more clearly understood from the following detailed description taken in conjunction with the accompanying drawings, in which:

DESCRIPTION OF THE PREFERRED EMBODIMENT

Figure 1A:
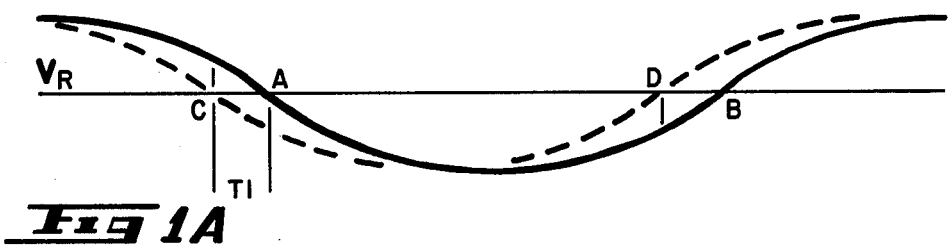
FIGS. 1a and 1b illustrate, in graphical form, the problem and solution with which the present invention is concerned.

FIG. 1a illustrates the phase lead error induced by a standard RC network. The solid waveform represents an A.C. signal applied to the input of a typical RC network, and the dashed waveform represents the output of the RC network. The input signal actually crosses a reference voltage $V_R$ at points A and B. However, the zero crossover points actually detected correspond to points C and D. Thus, there results an offset error t1 for each zero crossover point; i.e. early detection of the crossover points.

Figure 1B:
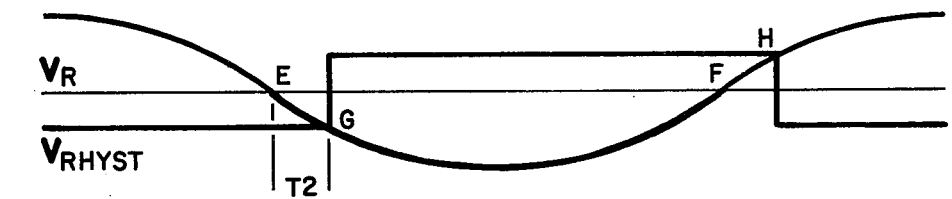

Assuming that an A.C. signal is applied to an ideal zero crossover detection circuit, adding hysteresis to the reference voltage will cause late detection of the zero crossovers. This is illustrated in FIG. 1b wherein an A.C. signal has superimposed thereon both a constant reference voltage $V_R$ and a hysteresis altered reference voltage $V_{RHYST}$. The A.C. signal crosses $V_R$ at points E and F; however, the A.C. signal crosses $V_{RHYST}$ at points G and H (i.e. late detection by an amount t2).

If the offset due to phase shift could be made equal to the hysteresis offset (t1=t2), accurate detection of the zero crossover points would occur. This is accomplished by the inventive detection circuit in a manner to be described below.

Figure 2:
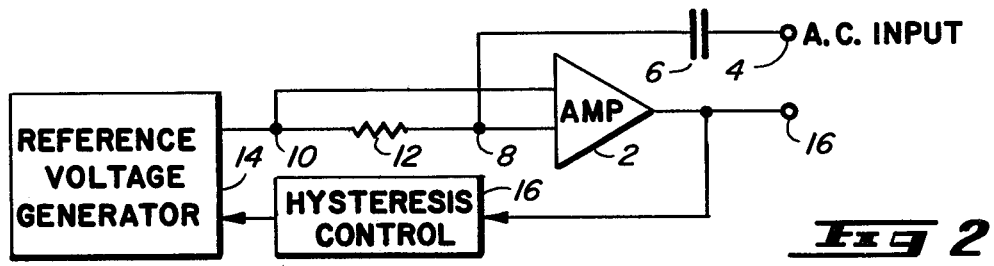
FIG. 2 is a functional block diagram of the inventive zero crossover detection circuit.

FIG. 2 is a functional block diagram of the inventive zero crossover detection circuit. A comparator such as a differential amplifier 2 has a first input coupled to an external capacitor 6 via node 8, which capacitor is also coupled to an A.C. input signal. The second input of amplifier 2 is coupled to node 10 at which there appears a reference voltage $V_R$ produced by reference voltage generator 14. The output of amplifier 2 (terminal 16) is fed back to a hysteresis control circuit 16 the output of which is in turn applied to generator 14 for adding or subtracting a controlled amount of hysteresis to the reference voltage $V_R$. The first input of amplifier 2 is also coupled to $V_R$ via biasing resistor 12. As stated previously, with the proper application of hysteresis to the reference voltage $V_R$, the phase lead imparted to the input A.C. input signal (terminal 4) by the combination of capacitor 6 and resistor 12 can be fully compensated for.

Figure 3:
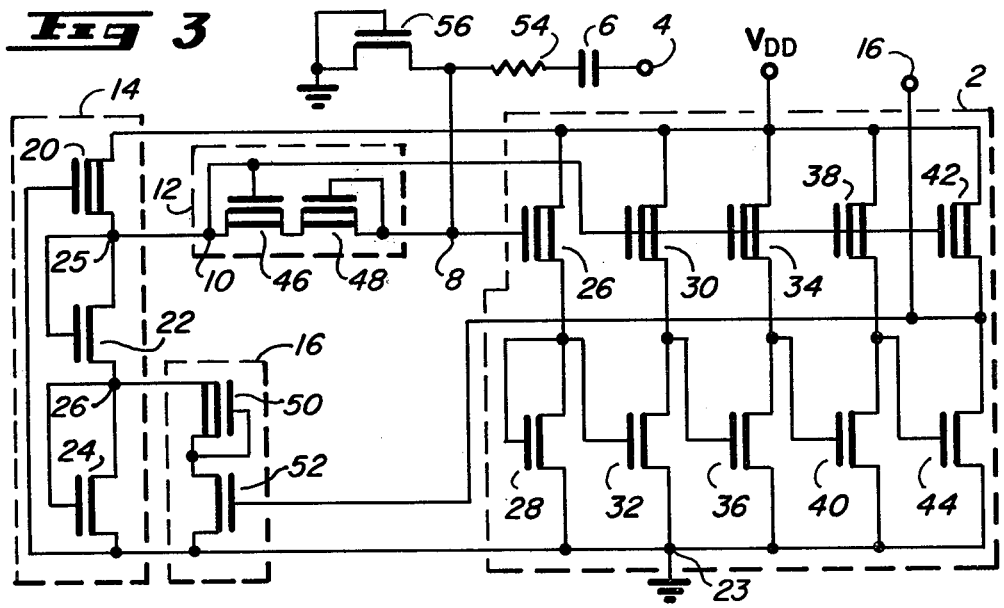
FIG. 3 is a detailed schematic diagram of the arrangement shown in FIG. 2.

FIG. 3 is a detailed schematic diagram of an A.C. zero crossover detection circuit in accordance with the present invention implemented with MOS field effect transistors. Functional units shown in FIG. 2 have been enclosed by dashed lines and are denoted with similar numerals in FIG. 3. Thus, voltage reference generator 14 comprises depletion device 20 and enhancement devices 22 and 24. Amplifier 2 comprises an input stage including depletion device 26 having a gate coupled to node 8, depletion device 30 having a gate coupled to node 10 and enhancement devices 28 and 32. Three additional amplifying stages each comprise the series combination of a depletion device having a gate coupled to node 10 and an enhancement device having a gate coupled to the output of the previous stage. Thus, the three additional stages include devices 34 and 36, 38 and 40, and 42 and 44 respectively. Resistor 12 comprises resistor connected depletion devices 46 and 48 coupled between node 10 ($V_R$) and node 8, and hysteresis control circuit comprises enhancement device 52 having a gate coupled to the amplifier output (terminal 16) and depletion device 50 connected as a resistor and having a drain coupled to reference voltage generator 14. Resistor 54 and enhancement device 56 form a standard input protection circuit.

Referring now to voltage reference generator 14, field effect transistor 20 is a depletion device having its drain connected to a voltage supply terminal Vdd and having its gate electrode connected to a second voltage power supply terminal 23. Power supply terminal 23 is illustrated as being a ground or reference point since for purposes of illustration all the transistors used herein are assumed to be N-channel field effect transistors. The source electrode of field effect transistor 20 is connected to node 25. Field effect transistors 22 and 24 are enhancement devices connected in series between node 25 and power supply terminal 23. Transistors 22 and 24 each have their gate electrodes connected to their drain electrodes. The source electrode of transistor 22 is connected to the drain electrode of transistor 24 while the source electrode of transistor 24 is connected to terminal 23. Transistors 20, 22 and 24 form a constant voltage reference generator which provides a constant voltage $V_R$ at output node 25. Once the power supply voltage applied to terminals Vdd and 23 exceeds a certain level the voltage appearing at node 25 remains constant even though the power supply voltage continues to rise. This reference voltage circuit is more fully described in copending patent application Ser. No. 939,725 filed Sept. 7, 1978 and therefore will not be further described herein.

Differential amplifier 2 may be of the type fully described in copending U.S. Patent application Ser. No. 35,039, filed May 1, 1979. In brief, the amplifier is preferably comprised of N-channel MOS devices and has a high ratio of differential gain to common mode gain. Each of the additional amplifying stages includes a depletion input load device having a gate coupled to one of the differential inputs. This balances the switching points of each stage over the common mode range. A detailed discussion may be found in the above cited U.S. application.

The output of amplifier 2 is fed back to the gate of enhancement device 52 which functions as a switch. When "ON", device 52 enables depletion device 50 to pull current from node 26 causing the voltage at node 26 to decrease. This results in a corresponding decrease in $V_R$ at node 25. When device 52 is switched "OFF" by amplifier 2, device 50 ceases pulling current and the voltage at node 25 ($V_R$) rises to its original value.

Resistor 12 is comprised of depletion devices 46 and 48 connected as resistors and having their current carrying electrodes coupled in series between nodes 8 and 10. Two important features of the invention should be noted at this time. First, the same source of voltage $V_R$ is used to supply one input of amplifier 2 directly and also biases the second input. Second, since devices 46, 48 and 50 are all of the same type, process variations which affect resistor 12 will correspondingly affect device 50. Thus, these devices will track each other; i.e. if devices 46 and 48 turn on harder producing a larger phase lead, device 50 will likewise turn on harder providing more hysteresis to compensate for the additional phase lead. It should be further appreciated that the addition of hysteresis not only compensates for the RC phase lead, but also provides noise immunity at the switching or zero crossover points.

For the sake of completeness, the following indicates suitable lengths and widths of the various MOS devices illustrated in FIG. 3.

| Element | Width/Length (Microns) |
| --- | --- |
| 20 | 100/10 |
| 22,24 | 80/10 |
| 26,30,34,38,42,50 | 8/20 |
| 28,32,36,40,44 | 130/8 |
| 46,48 | 7/20 |
| 52 | 30/6 |

The foregoing description of the embodiment of the invention is by way of example only and is not intended to limit the scope of the appended claims. No attempt has been made to illustrate all possible embodiments of the invention but rather only to illustrate its principles in the best manner presently known to practice them. For example, the circuit may be implemented in NMOS, PMOS, CMOS, bipolar, etc. These and other modifications may occur to one skilled in the art, and it is therefore intended that the invention include all modifications and equivalents which fall within the scope of the appended claims.

I claim:

1. An A.C. zero crossover detection circuit including hysteresis, comprising:
   first means for generating a reference voltage;
   comparing means having a first input coupled to said reference voltage and a second input coupled to an A.C. signal for detecting the crossover points thereof, said comparing means having an output indicative of said crossover points; and
   second means coupled to said comparing means and to said generating means for automatically altering the amount of said hysteresis to compensate for phase shift in said A.C. signal at each of said crossover points.

2. A circuit according to claim 1 wherein said comparing means is a differential amplifier.

3. A circuit according to claim 2 wherein said second means comprises:
   switching means coupled to the output of said differential amplifier and responsive thereto; and
   first resistive means coupled to said first means and responsive to said switching means for reducing said reference voltage when said switching means is in a first state.

4. A circuit according to claim 3 wherein said switching means comprises a first MOS device having a gate electrode coupled to the output of said differential amplifier, a source coupled to a first potential and a drain coupled to said first resistive means.

5. A circuit according to claim 4 wherein said first resistive means is a second MOS device having source, drain and gate electrodes, said gate electrode coupled to its source electrode and to the drain of said first MOS device and said drain electrode coupled to said first means.

6. A circuit according to claim 5 wherein said second MOS device is of a depletion type.

7. A circuit according to claim 6 further including second resistive means coupled between said reference voltage and said second input.

8. A circuit according to claim 7 wherein said second resistive means comprises third and fourth series coupled MOS devices.

9. A circuit according to claim 8 wherein said third and fourth MOS devices are of the depletion type.

10. A circuit according to claim 9 wherein said first, second, third and fourth devices are N-channel field effect transistors.

11. In an A.C. zero crossover detection circuit including hysteresis, apparatus for compensating for phase shift in an applied A.C. input signal which would result in incorrect detection of crossover points of said A.C. input signal with a reference voltage, comprising:
   comparing means having a first input, a second input coupled to said reference voltage and an output responsive to said crossover points; and
   first means coupled to said comparing means for automatically compensating for said phase shift at each of said crossover points by altering the amount of said hysteresis.

12. An apparatus according to claim 11 wherein said first means comprises:
   switching means coupled to said comparing means and responsive to an output thereof; and
   first resistive means coupled to said switching means for changing said reference voltage.

13. An apparatus according to claim 12 wherein said resistive means reduces said reference voltage when said switching means is in a first state.

14. An apparatus according to claim 13 wherein said switching means comprises a first field-effect-transistor having a gate electrode coupled to said output of said comparing means, a source electrode coupled to its source electrode and a drain electrode coupled to said first resistive means.

15. An apparatus according to claim 14 wherein said first resistive means comprises a second field effect transistor having source, drain and gate electrodes, said second field effect transistor connected as a resistor and having a source coupled to the drain of said first field-effect-transistor.

16. An apparatus according to claim 15 wherein said second field effect transistor is of the depletion type.

17. An apparatus according to claim 16 further including second resistive means coupled between said reference voltage and said first input.

18. An apparatus according to claim 17 wherein said second resistive means comprises third and fourth series coupled field effect transistors.

19. An apparatus according to claim 18 wherein said third and fourth field-effect-transistors are of the depletion type.

20. An apparatus according to claim 19 wherein said first, second, third and fourth field-effect transistors are N-channel.

21. An A.C. zero crossover detection circuit of the type wherein an A.C. input signal is phase shifted by a capacitor in combination with an internal resistor, comprising:
   first means for generating a reference voltage;
   comparing means for comparing said reference voltage with said A.C. signal to detect the crossover points thereof; and
   second means coupled to said first means and to said comparing means for adjusting said reference voltage to compensate for phase shift at each of said crossover points, said resistor coupled between said first means and said comparing means.

22. A circuit according to claim 21 wherein said comparing means is a differential amplifier.

23. A circuit according to claim 22 wherein said second means comprises:
   a first field-effect-transistor acting as a switch and having a gate coupled to the output of said comparing means; and
   a second field-effect-transistor connected as a resistor, said second field-effect-transistor having source and gate electrodes coupled to the drain of said first field-effect-transistor and having a drain electrode coupled to said first means for reducing said reference voltage when said switch is in a first state.

24. A circuit according to claim 23 further including third and fourth series coupled field-effect-transistors connected as resistors between said first means and said comparing means.

25. A circuit according to claim 24 wherein said second, third and fourth field-effect-transistors are of the depletion type.

26. A circuit according to claim 25 wherein said first, second, third and fourth field-effect-transistors are N-channel devices.

* * * * *